(12) United States Patent
Kwong

(10) Patent No.: US 6,487,083 B1
(45) Date of Patent: Nov. 26, 2002

(54) MULTILAYER CIRCUIT BOARD

(75) Inventor: Herman Kwong, Kanata (CA)

(73) Assignee: Nortel Networks Ltd. (CA)

( * ) Notice: Subject to any disclaimer, the term of this patent is extended or adjusted under 35 U.S.C. 154(b) by 44 days.

(21) Appl. No.: 09/636,595

(22) Filed: Aug. 10, 2000

(51) Int. Cl.[7] .............................................. H05K 7/06
(52) U.S. Cl. ...................... 361/761; 361/764; 361/780; 361/794; 361/818; 174/255; 174/260; 29/832; 29/852
(58) Field of Search ................................ 361/760–764, 361/782, 783, 792–795, 816, 818, 780; 174/252, 255, 260; 257/691, 700–703, 723, 724; 438/125; 29/830–832, 852

(56) References Cited

U.S. PATENT DOCUMENTS

| | | | | |
|---|---|---|---|---|
| 4,296,456 A | * | 10/1981 | Reid ........................... 361/771 |
| 5,285,352 A | * | 2/1994 | Pastore et al. ............... 361/707 |
| 5,359,488 A | * | 10/1994 | Leahy et al. ................. 361/761 |
| 5,371,321 A | * | 12/1994 | Hamzehdoost et al. ....... 29/832 |
| 5,420,460 A | * | 5/1995 | Massingill ................... 257/693 |
| 5,450,046 A | * | 9/1995 | Kosugi et al. ............... 361/761 |
| 5,567,654 A | * | 10/1996 | Beilstein, Jr. et al. ...... 438/109 |
| 5,625,166 A | * | 4/1997 | Natarajan .................. 174/52.4 |
| 5,679,978 A | * | 10/1997 | Kawahara et al. .......... 257/700 |
| 5,796,165 A | * | 8/1998 | Yoshikawa et al. ......... 257/700 |
| 5,798,014 A | * | 8/1998 | Weber .......................... 29/830 |
| 5,831,810 A | * | 11/1998 | Bird et al. ................... 361/763 |
| 5,994,771 A | * | 11/1999 | Sasaki et al. ................ 257/700 |
| 6,107,683 A | * | 8/2000 | Castro et al. ................ 257/700 |
| 6,121,679 A | * | 9/2000 | Luvara et al. ............... 257/700 |
| 6,225,570 B1 | * | 5/2001 | Ishiyama et al. ........... 361/762 |

* cited by examiner

Primary Examiner—Kamand Cuneo
Assistant Examiner—John B. Vigushin
(74) Attorney, Agent, or Firm—Hunton & Williams

(57) ABSTRACT

A technique for improving electrical signal performance in multilayer circuit boards by eliminating the need for electrically conductive vias is disclosed. In one embodiment, the technique is realized as an improved multilayer circuit board having an electrically conductive signal layer disposed beneath at least one dielectric layer. The improvement comprises a cavity in the multilayer circuit board extending through the at least one dielectric layer so as to expose at least a portion of the electrically conductive signal layer within the cavity. The cavity is sized to accommodate an electronic component therein such that the electronic component makes electrical contact with the exposed portion of the electrically conductive signal layer, thereby eliminating the need for an electrically conductive via electrically connected to the electrically conductive signal layer and formed through the at least one dielectric layer or any other layer of the multilayer circuit board.

22 Claims, 3 Drawing Sheets

MULTILAYER CIRCUIT BOARD

FIELD OF THE INVENTION

The present invention relates generally to multilayer circuit boards and, more particularly, to an improved multilayer circuit board for improving signal performance by eliminating the need for electrically conductive vias.

BACKGROUND OF THE INVENTION

The making of electrical connections between electronic components has long been accomplished using printed circuit boards. The first such circuit boards had only a single signal layer on the top surface thereof for routing electrical signals between electronic components mounted thereon. These single signal layer circuit boards have severe limitations with regard to the number of electrical signals that can be routed between electronic components mounted on the same circuit board. That is, the number of electrical signals that can be routed between electronic components mounted on a single signal layer circuit board is limited by the amount of area on the single signal layer. The area limitations associated with single signal layer circuit boards led to the development of multilayer printed circuit boards. Such multilayer printed circuit boards may be either single or double-sided and may have multiple signal layers on the surface of and buried within the multilayer printed circuit boards. Thus, such multilayer printed circuit boards have allowed a large increase in the number of electrical signals that may be routed between electronic components mounted on the same circuit board.

With the advent of multilayer printed circuit boards, however, new problems have arisen. For example, to make electrical connections between different layers in multilayer printed circuit boards, electrically conductive vias are generally used. While these electrically conductive vias allow direct vertical electrical connections to be made between different layers within a multilayer printed circuit board, there are intrinsic parasitics associated with these electrically conductive vias that can adversely affect the performance of signals propagating therethrough. That is, these electrically conductive vias have intrinsic parasitic resistance, capacitance, and inductance, which can adversely affect signals propagating along each electrically conductive via. Because of their adverse affect on signal performance, these intrinsic parasitics can also limit the bandwidth of signals propagating along each electrically conductive via.

To help illustrate the problems associated with electrically conductive vias, FIG. 1 shows a side cross-sectional view of a double-sided multilayer printed circuit board 10 having electrically conductive blind vias (microvias) 12 and electrically conductive buried vias 14 for making electrical connections between different layers in the multilayer printed circuit board 10, and between a first electronic component 16 and a second electronic component 18 mounted on opposite sides of the multilayer printed circuit board 10. The multilayer printed circuit board 10 comprises a primary (top) layer 20, a secondary (bottom) layer 22, and a plurality of intermediate layers 24. The top layer 20 and the bottom layer 22 are typically electrically conductive power/ground plane layers, but also have the separate electrically conductive microvias 12 formed therein for making electrical connections with the electronic components 16 and 18 mounted on the top layer 20 and the bottom layer 22 of the multilayer printed circuit board 10. The intermediate layers 24 alternate between non-electrically conductive dielectric layers and either electrically conductive signal layers or electrically conductive power/ground plane layers. For example, in FIG. 1, layers 26, 28, ... 46 are non-electrically conductive dielectric layers, layers 48, 52, 56, 58, 62, and 66 are electrically conductive signal layers, and layers 50, 54, 60, and 64 (as well as layers 20 and 22) are electrically conductive power/ground plane layers.

As can be seen in FIG. 1, electrically conductive runs on signal layers 48, 56, and 66 are electrically connected to electrically conductive buried via 14a, and electrically conductive runs on signal layers 48, 62, and 66 are electrically connected to electrically conductive buried via 14b. FIG. 1 also shows a first electrically conductive run on signal layer 48 electrically connecting the electrically conductive microvia 12a to electrically conductive buried via 14a, a second electrically conductive run on signal layer 48 electrically connecting the electrically conductive microvia 12b to electrically conductive buried via 14b, a first electrically conductive run on signal layer 66 electrically connecting the electrically conductive microvia 12c to electrically conductive buried via 14a, and a second electrically conductive run on signal layer 66 electrically connecting the electrically conductive microvia 12d to electrically conductive buried via 14b.

As previously mentioned, both the electrically conductive microvias 12 and the electrically conductive buried vias 14 shown in FIG. 1, as well as other kinds of electrically conductive vias (e.g., supervias, not shown, which are plated through holes connecting the top and bottom layers), have intrinsic parasitic resistance, capacitance, and inductance, which can adversely affect the performance of electrical signals propagating along each electrically conductive via, particularly signals propagating at high speed thereby adversely affecting signal bandwidth. These intrinsic parasitics are compounded by delicate interconnections between electrically conductive vias and electrically conductive signal layer runs, and by varying electroplating thicknesses in via barrels across the board, as well as by transmission line effects resulting from unnecessarily long signal path lengths due to awkward via placements and lengths. That is, anything other than a direct run on the same electrically conductive signal layer results in decreased electrical signal performance.

In view of the foregoing, it would be desirable to provide a technique for improving electrical signal performance in multilayer printed circuit boards by eliminating the need for electrically conductive vias.

SUMMARY OF THE INVENTION

According to the present invention, a technique for improving electrical signal performance in multilayer circuit boards by eliminating the need for electrically conductive vias is provided. In a preferred embodiment, the technique is realized as an improved multilayer circuit board having an electrically conductive signal layer disposed beneath at least one dielectric layer. The improvement comprises a cavity in the multilayer circuit board extending through the at least one dielectric layer so as to expose at least a portion of the electrically conductive signal layer within the cavity. The cavity is sized to accommodate an electronic component therein such that the electronic component makes electrical contact with the exposed portion of the electrically conductive signal layer, thereby eliminating the need for an electrically conductive via electrically connected to the electrically conductive signal layer and formed through the at least one dielectric layer or any other layer of the multilayer circuit board. The electronic component is typically either an integrated circuit component or a discrete component.

In accordance with other aspects of the present invention, at least the lateral dimensions of the cavity are beneficially sized to directly coincide with at least the lateral dimensions of the electronic component. This alleviates the need for any specialized positioning equipment, which has heretofore typically been required when mounting electronic components on circuit boards.

In accordance with further aspects of the present invention, the cavity is beneficially formed as a channel through which air may be forced for cooling at least the electronic component.

In accordance with still further aspects of the present invention, wherein the electrically conductive signal layer is a first electrically conductive layer, wherein the multilayer circuit board has a second electrically conductive layer disposed above the at least one dielectric layer, and wherein the cavity also extends through the second electrically conductive layer, the improvement further beneficially comprises an electrically conductive shield electrically connected to the second electrically conductive layer for shielding electromagnetic interference to and from the electronic component. The second electrically conductive layer is typically an electrically conductive power/ground plane layer, although the second electrically conductive layer may also be an additional electrically conductive signal layer. Also, wherein the multilayer circuit board has at least one second dielectric layer disposed above the second electrically conductive layer, the improvement further beneficially comprises a second cavity in the multilayer circuit board extending through the at least one second dielectric layer so as to expose at least a portion of the second electrically conductive layer within the second cavity where the electrically conductive shield is electrically connected to the second electrically conductive layer. The second cavity is typically sized so as to be larger in lateral dimension than the first cavity.

In accordance with still further aspects of the present invention, wherein the multilayer circuit board is a double-sided multilayer circuit board, wherein the cavity is a first cavity on a first side of the multilayer circuit board, wherein the electrically conductive signal layer is a first electrically conductive signal layer, wherein the at least one dielectric layer is at least one first dielectric layer, wherein the electronic component is a first electronic component, and wherein the multilayer circuit board has a second electrically conductive signal layer disposed beneath at least one second dielectric layer relative to a second side of the multilayer circuit board, the improvement further beneficially comprises a second cavity on the second side of the multilayer circuit board extending through the at least one second dielectric layer so as to expose at least a portion of the second electrically conductive signal layer within the second cavity. Similar to above, the second cavity is sized to accommodate a second electronic component therein such that the second electronic component makes electrical contact with the exposed portion of the second electrically conductive signal layer, thereby eliminating the need for an electrically conductive via electrically connected to the second electrically conductive signal layer and formed through the at least one second dielectric layer or any other layer of the multilayer circuit board. Significantly, the second cavity can be located substantially opposite the first cavity in the multilayer circuit board.

In an alternative embodiment, the technique is realized as a method for improving electrical signal performance in multilayer circuit boards by eliminating the need for electrically conducting vias. The method assumes a multilayer circuit board has an electrically conductive signal layer disposed beneath at least one dielectric layer. The method comprises forming a cavity in the multilayer circuit board extending through the at least one dielectric layer so as to expose at least a portion of the electrically conductive signal layer within the cavity. The cavity is sized to accommodate an electronic component therein such that the electronic component makes electrical contact with the exposed portion of the electrically conductive signal layer, thereby eliminating the need for an electrically conductive via electrically connected to the electrically conductive signal layer and formed through the at least one dielectric layer or any other layer of the multilayer circuit board.

In accordance with other aspects of the present invention, the cavity may be formed by etching the cavity in the multilayer circuit board. For example, the cavity may be formed by photolithographically etching the cavity in the multilayer circuit board, or plasma etching the cavity in the multilayer circuit board. Alternatively, the cavity may be formed by milling the cavity in the multilayer circuit board. For example, the cavity may be formed by laser ablating the cavity in the multilayer circuit board. Alternatively still, the cavity may be formed by prefabricating the at least one dielectric layer such that the cavity is formed upon assembly of the electrically conductive signal layer and the at least one dielectric layer into the multilayer circuit board.

In accordance with further aspects of the present invention, wherein the electrically conductive signal layer is a first electrically conductive layer, wherein the multilayer circuit board has a second electrically conductive layer disposed above the at least one dielectric layer, and wherein the cavity also extends through the second electrically conductive layer, the method further beneficially comprises electrically connecting an electrically conductive shield to the second electrically conductive layer for shielding electromagnetic interference to and from the electronic component. If the multilayer circuit board has at least one dielectric layer disposed above the second electrically conductive layer, the method may further beneficially comprise forming a second cavity in the multilayer circuit board extending through the at least one second dielectric layer so as to expose at least a portion of the second electrically conductive layer within the second cavity where the electrically conductive shield is electrically connected to the second electrically conductive layer.

In accordance with still further aspects of the present invention, wherein the multilayer circuit board is a double-sided multilayer circuit board, wherein the cavity is a first cavity on a first side of the multilayer circuit board, wherein the electrically conductive signal layer is a first electrically conductive signal layer, wherein the at least one dielectric layer is at least one first dielectric layer, wherein the electronic component is a first electronic component, and wherein the multilayer circuit board has a second electrically conductive signal layer disposed beneath at least one second dielectric layer relative to a second side of the multilayer circuit board, the method further beneficially comprises forming a second cavity on the second side of the multilayer circuit board extending through the at least one second dielectric layer so as to expose at least a portion of the second electrically conductive signal layer within the second cavity. Similar to above, the second cavity is sized to accommodate a second electronic component therein such that the second electronic component makes electrical contact with the exposed portion of the second electrically conductive signal layer, thereby eliminating the need for an electrically conductive via electrically connected to the second electrically conductive signal layer and formed through the at least one second dielectric layer or any other layer of the multilayer circuit board.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENT(S)

Figure 1:
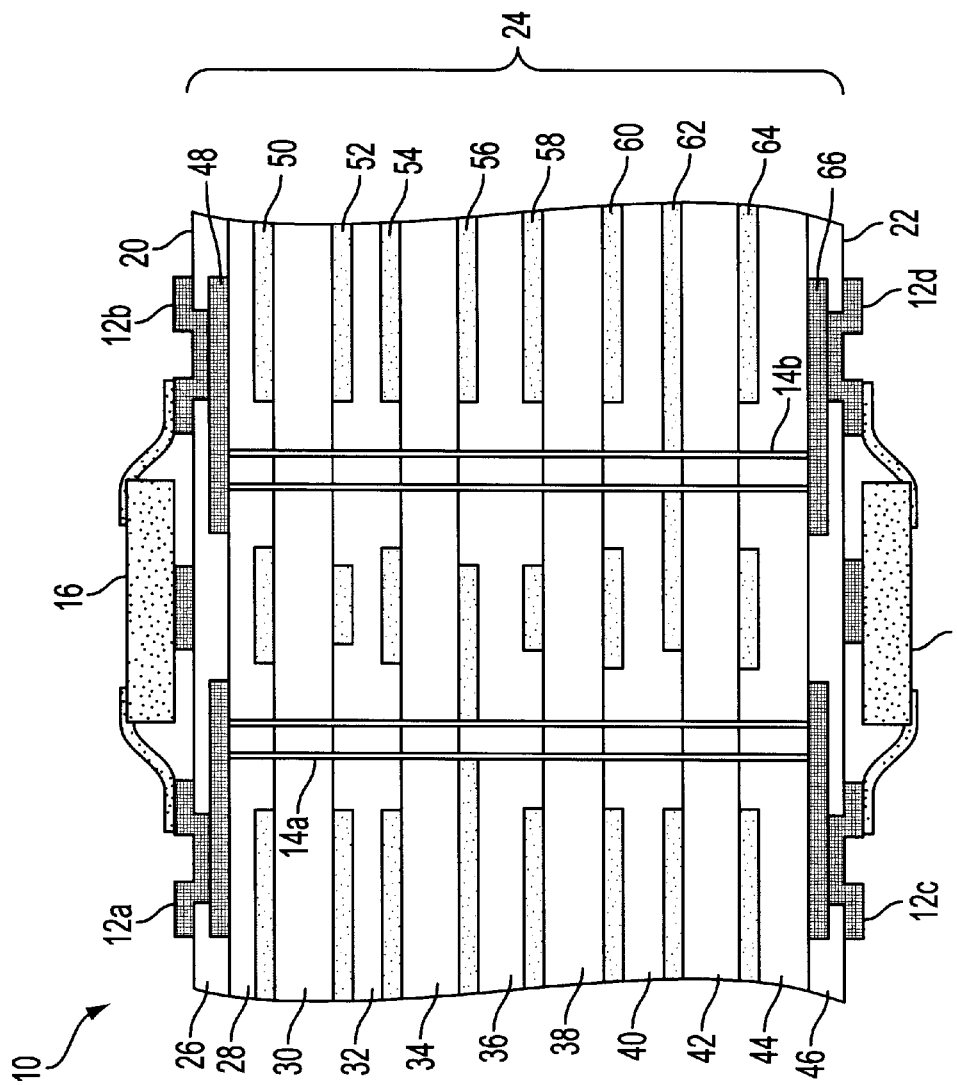
FIG. 1 is a side cross-sectional view of a prior art double-sided multilayer printed circuit board having electrically conductive microvias and electrically conductive buried vias for making electrical connections between different layers in the multilayer printed circuit board, and between electronic components mounted on the same or opposite sides of the multilayer printed circuit board.
Figure 2:
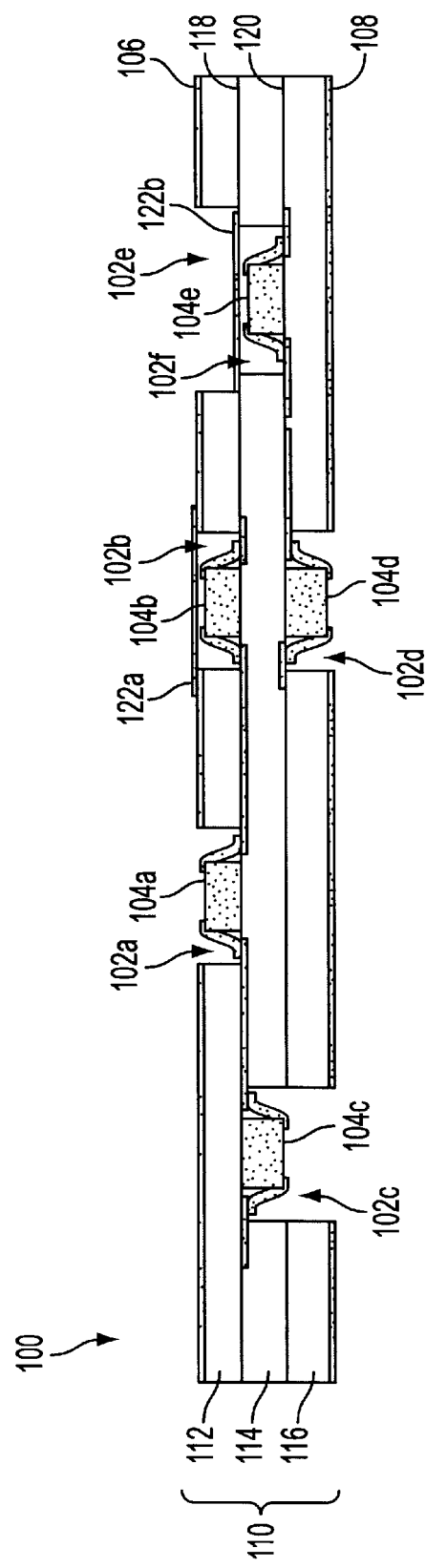
FIG. 2 is a side cross-sectional view of a double-sided multilayer printed circuit board having cavities formed therein for accommodating electronic components therein in accordance with the present invention.

Referring to FIG. 2, there is shown a side cross-sectional view of a double-sided multilayer printed circuit board 100 having cavities 102 formed therein for accommodating electronic components 104 therein in accordance with the present invention. The multilayer printed circuit board 100 comprises a primary (top) layer 106, a secondary (bottom) layer 108, and a plurality of intermediate layers 110. The top layer 106 and the bottom layer 108 are typically electrically conductive power/ground plane layers, but may also have electrically conductive contact pads and electrically conductive signal runs (not shown) to which electronic components may be electrically connected. The intermediate layers 110 alternate between non-electrically conductive dielectric layers and either electrically conductive signal layers or electrically conductive power/ground plane layers. For example, in FIG. 2, layers 112, 114, and 116 are non-electrically conductive dielectric layers, layers 118 and 120 are electrically conductive signal layers, and layers 106 and 108 are electrically conductive power/ground plane layers.

A first cavity 102a accommodates a first electronic component 104a therein. The first cavity 102a is formed through the electrically conductive top layer 106 and the non-electrically conductive dielectric layer 112 so as to expose electrically conductive contact pads formed on the electrically conductive signal layer 118. The first electronic component 104a has a gull wing leaded package. The gull wing leads of the first electronic component 104a are electrically connected to the electrically conductive contact pads formed on the electrically conductive signal layer 118, which are exposed within the first cavity 102a.

A second cavity 102b accommodates a second electronic component 104b therein. Similar to the first cavity 102a, the second cavity 102b is formed through the electrically conductive top layer 106 and the non-electrically conductive dielectric layer 112 so as to expose electrically conductive contact pads formed on the electrically conductive signal layer 118. Similar to the first electronic component 104a, the second electronic component 104b has a gull wing leaded package. Also similar to the first electronic component 104a, the gull wing leads of the second electronic component 104b are electrically connected to the electrically conductive contact pads formed on the electrically conductive signal layer 118, which are exposed within the second cavity 102b.

The electrically conductive signal layer 118 has electrically conductive signal runs formed therein which electrically connect the electrically conductive contact pads exposed within the first cavity 102a with the electrically conductive contact pads exposed within the second cavity 102b. Thus, these electrically conductive signal runs formed in the electrically conductive signal layer 118 allow electrical signals to propagate directly between the first electronic component 104a and the second electronic component 104b without having to propagate through any electrically conductive vias. That is, since both the first electronic component 104a and the second electronic component 104b are directly electrically connected to electrically conductive signal runs formed in the same signal layer (i.e., the electrically conductive signal layer 118), there is no need for any electrically conductive vias for electrically connecting the first electronic component 104a and the second electronic component 104b.

At this point it should be noted that the second cavity 102b is covered by a first electrically conductive shielding plate 122a for shielding electromagnetic interference (EMI) to or from the second electronic component 104b. That is, the first electrically conductive shielding plate 122a is electrically connected to the electrically conducting power/ground plane layer 106, thereby providing a shield for any EMI which may be emanating from the second electronic component 104b or against any EMI to which the second electronic component 104b may be susceptible. It should also be noted that such electrically conductive shielding plates may also be electrically connected to electrically conductive signal layers, and to layers other than the top layer 106 or the bottom layer 108 of the multilayer printed circuit board 100, as will be described in detail below. It should further be noted that the first electrically conductive shielding plate 122a could be in physical contact with the second electronic component 104b such that the first electrically conductive shielding plate 122a also acts as a heat sink for the second electronic component 104b, as will also be described in detail below.

A third cavity 102c is formed on the opposite side of the multilayer printed circuit board 100 than the first cavity 102a and the second cavity 102b. The third cavity 102c accommodates a third electronic component 104c therein. The third cavity 102c is formed through the electrically conductive bottom layer 108, the non-electrically conductive dielectric layer 116, the electrically conductive signal layer 120, and the non-electrically conductive dielectric layer 114 so as to expose electrically conductive contact pads formed on the electrically conductive signal layer 118. Similar to the first electronic component 104a and the second electronic component 104b, the third electronic component 104c has a gull wing leaded package. Also similar to the first electronic component 104a and the second electronic component 104b, the gull wing leads of the third electronic component 104c are electrically connected to the electrically conductive contact pads formed on the electrically conductive signal layer 118, which are exposed within the third cavity 102c.

The electrically conductive signal layer 118 has electrically conductive signal runs formed therein which electrically connect the electrically conductive contact pads exposed within the third cavity 102c with the electrically conductive contact pads exposed within the first cavity 102a and the second cavity 102b. Thus, these electrically conductive signal runs formed in the electrically conductive signal layer 118 allow electrical signals to propagate directly between the first electronic component 104a, the second electronic component 104b, and the third electronic component 104c without having to propagate through any electrically conductive vias. That is, since the first electronic component 104a, the second electronic component 104b, and the third electronic component 104c are directly electrically connected to electrically conductive signal runs formed in the same signal layer (i.e., the electrically conductive signal layer 118), there is no need for any electrically conductive vias for electrically connecting the first electronic component 104a, the second electronic component 104b, and the third electronic component 104c.

At this point it should be noted, as evidenced by the third cavity 102c, that cavities may be formed in either side of the double-sided multilayer printed circuit board 100, and to different depths within the double-sided multilayer printed circuit board 100. Also, cavities can be formed in both sides of the double-sided multilayer printed circuit board 100 with no detrimental effects to the structure of the double-sided multilayer printed circuit board 100. That is, as long as one or more layers are still present beneath a cavity, there should be no detrimental effects to the structure of the double-sided multilayer printed circuit board 100. In fact, regardless of whether there is an opposing cavity formed in the double-sided multilayer printed circuit board 100, there should be no detrimental effects to the structure of the double-sided multilayer printed circuit board 100. However, even if structural integrity is a concern, most, if not all, printed circuit boards in use today use board edge stiffeners to provide additional structural support and prevent against warpage.

To illustrate the above point, a fourth cavity 102d is formed in the multilayer printed circuit board 100 directly opposite the second cavity 102b. The fourth cavity 102d accommodates a fourth electronic component 104d therein. The fourth cavity 102d is formed through the electrically conductive bottom layer 108 and the non-electrically conductive dielectric layer 116 so as to expose electrically conductive contact pads formed on the electrically conductive signal layer 120. Similar to the first, second, and third electronic components 104a, 104b and 104c, respectively, the fourth electronic component 104d has a gull wing leaded package. Also similar to the first, second, and third electronic components 104a, 104b and 104c, respectively, the gull wing leads of the fourth electronic component 104d are electrically connected to the electrically conductive contact pads formed on the electrically conductive signal layer 120, which are exposed within the fourth cavity 102d. A pair of connecting cavities (i.e., a fifth cavity 102e and a sixth cavity 102f) are also formed in the multilayer printed circuit board 100 for accommodating a second electrically conductive shielding plate 122b and a fifth electronic component 104e, respectively. Similar to the first cavity 102a, the fifth cavity 102e is formed through the electrically conductive top layer 106 and the non-electrically conductive dielectric layer 112 so as to expose at least a portion of the electrically conductive signal layer 118 within the fifth cavity 102e. The portion of the electrically conductive signal layer 118 that is exposed within the fifth cavity 102e has electrically conductive contact pads formed thereon. The second electrically conductive shielding plate 122b is electrically connected to the electrically conductive contact pads formed on the electrically conductive signal layer 118, and exposed within the fifth cavity 102e. These electrically conductive contact pads that are formed on the electrically conductive signal layer 118, and exposed within the fifth cavity 102e, are typically electrically connected to electrically conductive signal runs also formed on the electrically conductive signal layer 118. These electrically conductive signal runs that are formed on the electrically conductive signal layer 118 are preferably connected to ground. Similar to the first electrically conductive shielding plate 122a, the second electrically conductive shielding plate 122b provides a shield for any EMI which may be emanating from the fifth electronic component 104e or against any EMI to which the fifth electronic component 104e may be susceptible. Also, similar to the first electrically conductive shielding plate 122a, the second electrically conductive shielding plate 122b could be in physical contact with the fifth electronic component 104e such that the second electrically conductive shielding plate 122b also acts as a heat sink for the fifth electronic component 104e.

The sixth cavity 102f is formed through the electrically conductive signal layer 118 and the non-electrically conductive dielectric layer 114 so as to expose electrically conductive contact pads formed on the electrically conductive signal layer 120. Obviously, the sixth cavity 102f has a smaller lateral dimension than the fifth cavity 102e so as to allow the electrically conductive contact pads that are formed on the electrically conductive signal layer 118 to be exposed within the fifth cavity 102e.

Similar to the first, second, third, and fourth electronic component 104a, 104b, 104c, and 104d, respectively, the fifth electronic component 104e has a gull wing leaded package. Similar to the fourth electronic component 104d, the gull wing leads of the fifth electronic component 104e are electrically connected to the electrically conductive contact pads formed on the electrically conductive signal layer 120, which are exposed within the sixth cavity 102f.

The electrically conductive signal layer 120 has electrically conductive signal runs formed therein which electrically connect the electrically conductive contact pads exposed within the fourth cavity 102d with the electrically conductive contact pads exposed within the sixth cavity 102f. Thus, these electrically conductive signal runs formed in the electrically conductive signal layer 120 allow electrical signals to propagate directly between the fourth electronic component 104d and the fifth electronic component 104e without having to propagate through any electrically conductive vias. That is, since both the fourth electronic component 104d and the fifth electronic component 104e are directly electrically connected to electrically conductive signal runs formed in the same signal layer (i.e., the electrically conductive signal layer 120), there is no need for any electrically conductive vias for electrically connecting the fourth electronic component 104d and the fifth electronic component 104e.

At this point it should be noted that all of the cavities described herein are sized so as to allow a respective electronic component to be mounted therein such that the leads/contacts of the electronic component may be electrically connected to electrically conductive contact pads that are formed on the electrically conductive signal layer that is exposed within the cavity. Thus, each cavity must be sized so as to accommodate each respective electronic component. However, it is within the scope of the present invention to precisely size any or all of the cavities to directly coincide with the outer dimensions of each respective electronic component. This precise sizing of the cavities allows the electronic components to be positioned within the cavities without the need for any specialized positioning equipment, which has heretofore typically been required when mounting electronic components on printed circuit boards.

Figure 3:
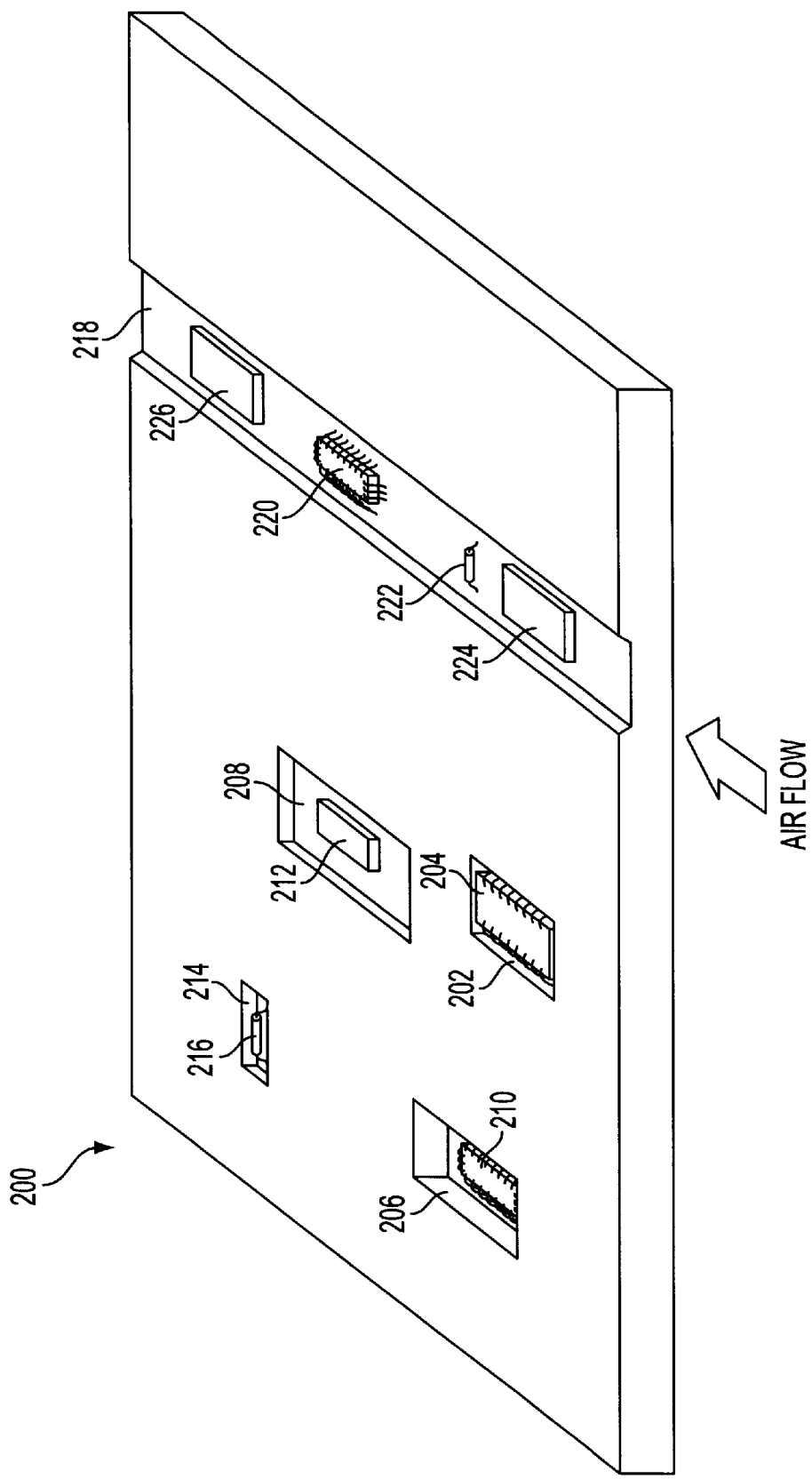
FIG. 3 is a perspective cross-sectional view of a double-sided multilayer printed circuit board having a plurality of different sized cavities formed therein for accommodating different types of electronic components therein in accordance with the present invention.

Referring to FIG. 3, there is shown a perspective cross-sectional view of a double-sided multilayer printed circuit board 200 having a plurality of different sized cavities formed therein for accommodating different types of electronic components therein. For example, a cavity 202 is precisely sized so as to allow the precision placement therein of an electronic component 204 having a gull wing leaded package without the need for any specialized positioning equipment, in accordance with the precise sizing aspect of the present invention mentioned above. Due to thermal considerations, this precise-sizing concept may be preferred for low power electronic components, which do not generate large amounts of heat and can therefore be cooled by conduction through contact with the double-sided multilayer printed circuit board 200.

Cavities 206 and 208 are sized larger than the respective electronic components mounted therein. Cavity 206 accommodates an electronic component 210 having a gull wing leaded package, while cavity 208 accommodates an electronic component 212 having a ball grid array package. Also, cavity 206 is deeper than cavity 208. Due to thermal considerations, this over-sizing concept exhibited by cavities 206 and 208 may be preferred for medium power electronic components, which generate a medium amount of heat and can therefore be cooled by a combination of conduction through contact with the double-sided multilayer printed circuit board 200 and convection through contact with air flowing naturally over each electronic component. Cavity 214 is sized to accommodate a discrete electronic component 216 having a surface mount package. Importantly, while all of the above-described embodiments have been described with the electronic components having gull wing leaded packages or ball grid array packages, the present invention is not limited in this regard. For example, electronic components having dual-in-line packages (DIP), pin grid array (PGA) packages, and leadless chip carrier packages, to name a few, can also be mounted within cavities in accordance with the practices of the present invention so as to avoid the need for electrically conductive vias. Also, in addition to integrated circuit components, discrete electronic components may also be mounted within cavities in accordance with the practices of the present invention, as exhibited by cavity 214 and discrete electronic component 216.

A cavity may also be sized to accommodate more than one electronic component and be shaped in many different manners. For example, cavity 218 is in the form of a channel which accommodates an electronic component 220 having a gull wing leaded package, a discrete electronic component 222 having a surface mount package, and two electronic components 224 and 226 having ball grid array packages. Due to thermal considerations, this channel-sizing concept exhibited by cavity 218 may be preferred for high power electronic components, which generate a high amount of heat and must therefore be cooled by a combination of conduction through contact with the double-sided multilayer printed circuit board 200 and forced air cooling through contact with air being forced down the channel, as shown in FIG. 3.

At this point it should be noted that the above-described cavities and/or channels can be formed using several different types of fabrication methods. For example, photolithographic or plasma-based etching can be used to form cavities and/or channels in a resin or epoxy-based multilayer printed circuit board in accordance with the present invention. Alternatively, if a multilayer printed circuit board is glass reinforced (and thereby not easily etchable by conventional etching techniques) precision milling by laser ablation using a $CO_2$ laser can be used to form cavities and/or channels in a multilayer printed circuit board in accordance with the present invention. Alternatively still, the dielectric layers and/or the electrically conductive layers may be prefabricated such that the cavities/channels are formed upon assembly of the dielectric layers and the electrically conductive layers into the multilayer circuit board.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. An improved multilayer circuit board, the multilayer circuit board having an electrically conductive signal layer disposed beneath at least one dielectric layer, the improvement comprising:

a cavity in the multilayer circuit board extending through the at least one dielectric layer so as to expose at least a portion of the electrically conductive signal layer within the cavity, wherein the cavity is sized to accommodate an electronic component therein such that the electronic component is mounted on and makes electrical contact with the exposed portion of the electrically conductive signal layer, thereby eliminating the need for an electrically conductive via electrically connected to the electrically conductive signal layer and formed through the at least one dielectric layer or any other layer of the multilayer circuit board.

2. The improved multilayer circuit board as defined in claim 1, wherein the electronic component is one of an integrated circuit component and a discrete component.

3. The improved multilayer circuit board as defined in claim 1, wherein at least the lateral dimensions of the cavity are sized to directly coincide with at least the lateral dimensions of the electronic component.

4. The improved multilayer circuit board as defined in claim 1, wherein the cavity is a channel through which air may be forced for cooling at least the electronic component.

5. The improved multilayer circuit board as defined in claim 1, wherein the electrically conductive signal layer is a first electrically conductive layer, wherein the multilayer circuit board has a second electrically conductive layer disposed above the at least one dielectric layer, wherein the cavity also extends through the second electrically conductive layer, the improvement further comprising:

an electrically conductive shield electrically connected to the second electrically conductive layer for shielding electromagnetic interference to and from the electronic component.

6. The improved multilayer circuit board as defined in claim 5, wherein the second electrically conductive layer is an electrically conductive power/ground plane layer.

7. The improved multilayer circuit board as defined in claim 5, wherein the electrically conductive signal layer is a first electrically conductive signal layer, and wherein the second electrically conductive layer is a second electrically conductive signal layer.

8. The improved multilayer circuit board as defined in claim 5, wherein the electrically conductive shield is in contact with the electronic component for dissipating heat from the electronic component.

9. The improved multilayer circuit board as defined in claim 5, wherein the cavity is a first cavity, wherein the at least one dielectric layer is at least one first dielectric layer, wherein the multilayer circuit board has at least one second dielectric layer disposed above the second electrically conductive layer, the improvement further comprising:

a second cavity in the multilayer circuit board extending through the at least one second dielectric layer so as to expose at least a portion of the second electrically conductive layer within the second cavity where the electrically conductive shield is electrically connected to the second electrically conductive layer.

10. The improved multilayer circuit board as defined in claim 9, wherein the second cavity is sized so as to be larger in lateral dimension than the first cavity.

11. The improved multilayer circuit board as defined in claim 1, wherein the multilayer circuit board is a double-sided multilayer circuit board, wherein the cavity is a first cavity on a first side of the multilayer circuit board, wherein the electrically conductive signal layer is a first electrically conductive signal layer, wherein the at least one dielectric layer is at least one first dielectric layer, wherein the electronic component is a first electronic component, wherein the multilayer circuit board has a second electrically conductive signal layer disposed beneath at least one second dielectric layer relative to a second side of the multilayer circuit board, the improvement further comprising:

a second cavity on the second side of the multilayer circuit board extending through the at least one second dielectric layer so as to expose at least a portion of the second electrically conductive signal layer within the second cavity, wherein the second cavity is sized to accommodate a second electronic component therein such that the second electronic component makes electrical contact with the exposed portion of the second electrically conductive signal layer, thereby eliminating the need for an electrically conductive via electrically connected to the second electrically conductive signal layer and formed through the at least one second dielectric layer or any other layer of the multilayer circuit board.

12. The improved multilayer circuit board as defined in claim 11, wherein the second cavity is located substantially opposite the first cavity in the multilayer circuit board.

13. A method for eliminating the need for electrically conducting vias in a multilayer circuit board, the multilayer circuit board having an electrically conductive signal layer disposed beneath at least one dielectric layer, the method comprising the step of:

forming a cavity in the multilayer circuit board extending through the at least one dielectric layer so as to expose at least a portion of the electrically conductive signal layer within the cavity, wherein the cavity is sized to accommodate an electronic component therein such that the electronic component is mounted on and makes electrical contact with the exposed portion of the electrically conductive signal layer, thereby eliminating the need for an electrically conductive via electrically connected to the electrically conductive signal layer and formed through the at least one dielectric layer or any other layer of the multilayer circuit board.

14. The method as defined in claim 13, wherein the step of forming a cavity comprises the step of:

etching the cavity in the multilayer circuit board.

15. The method as defined in claim 14, wherein the step of etching the cavity includes photolithographically etching the cavity in the multilayer circuit board.

16. The method as defined in claim 14, wherein the step of etching the cavity includes plasma etching the cavity in the multilayer circuit board.

17. The method as defined in claim 13, wherein the step of forming a cavity comprises the step of:

milling the cavity in the multilayer circuit board.

18. The method as defined in claim 17, wherein the step of milling the cavity includes laser ablating the cavity in the multilayer circuit board.

19. The method as defined in claim 13, wherein the step of forming a cavity comprises the step of:

prefabricating the at least one dielectric layer such that the cavity is formed upon assembly of the electrically conductive signal layer and the at least one dielectric layer in the multilayer circuit board.

20. The method as defined in claim 13, wherein the electrically conductive signal layer is a first electrically conductive layer, wherein the multilayer circuit board has a second electrically conductive layer disposed above the at least one dielectric layer, wherein the cavity also extends through the second electrically conductive layer, the method further comprising the step of:

electrically connecting an electrically conductive shield to the second electrically conductive layer for shielding electromagnetic interference to and from the electronic component.

21. The method as defined in claim 20, wherein the cavity is a first cavity, wherein the at least one dielectric layer is at least one first dielectric layer, wherein the multilayer circuit board has at least one second dielectric layer disposed above the second electrically conductive layer, the method further comprising the step of:

forming a second cavity in the multilayer circuit board extending through the at least one second dielectric layer so as to expose at least a portion of the second electrically conductive layer within the second cavity where the electrically conductive shield is electrically connected to the second electrically conductive layer.

22. The method as defined in claim 13, wherein the multilayer circuit board is a double-sided multilayer circuit board, wherein the cavity is a first cavity on a first side of the multilayer circuit board, wherein the electrically conductive signal layer is a first electrically conductive signal layer, wherein the at least one dielectric layer is at least one first dielectric layer, wherein the electronic component is a first electronic component, wherein the multilayer circuit board has a second electrically conductive signal layer disposed beneath at least one second dielectric layer relative to a second side of the multilayer circuit board, the method further comprising:

forming a second cavity on the second side of the multilayer circuit board extending through the at least one second dielectric layer so as to expose at least a portion of the second electrically conductive signal layer within the second cavity, wherein the second cavity is sized to accommodate a second electronic component therein such that the second electronic component makes electrical contact with the exposed portion of the second electrically conductive signal layer, thereby eliminating the need for an electrically conductive via electrically connected to the second electrically conductive signal layer and formed through the at least one second dielectric layer or any other layer of the multilayer circuit board.

* * * * *